(12) United States Patent
Meyer

(10) Patent No.: US 7,911,754 B2
(45) Date of Patent: Mar. 22, 2011

(54) DETECTION OF CURRENT LEAKAGE THROUGH OPTO-SWITCHES

(75) Inventor: Eitan Meyer, Nesher (IL)

(73) Assignee: Biosense Webster, Inc., Diamond Bar, CA (US)

( * ) Notice: Subject to any disclaimer, the term of this patent is extended or adjusted under 35 U.S.C. 154(b) by 547 days.

(21) Appl. No.: 12/017,137

(22) Filed: Jan. 21, 2008

(65) Prior Publication Data

US 2009/0185320 A1    Jul. 23, 2009

(51) Int. Cl.
*H02H 3/00* (2006.01)
(52) U.S. Cl. .......................................... 361/78; 361/93.7
(58) Field of Classification Search .................... 361/78, 361/93.7
See application file for complete search history.

(56) References Cited

U.S. PATENT DOCUMENTS

| 3,963,981 | A | | 6/1976 | Vis |
| 4,142,150 | A | * | 2/1979 | Morrow et al. ............. 324/765 |
| 4,216,462 | A | * | 8/1980 | McGrath et al. ........... 600/301 |
| 5,323,014 | A | | 6/1994 | Liscio et al. |
| 6,402,286 | B1 | * | 6/2002 | Hu et al. ..................... 347/19 |
| 6,998,851 | B2 | * | 2/2006 | van Spengen ............... 324/523 |
| 2004/0243288 | A1 | * | 12/2004 | Kito et al. .................. 701/29 |
| 2008/0042639 | A1 | * | 2/2008 | Oster ........................... 324/133 |

FOREIGN PATENT DOCUMENTS

| DE | 19510333 | * | 10/1996 |
| JP | 04 238272 A | | 5/2009 |

OTHER PUBLICATIONS

Dual-Channel Optocoupler/Optoisolator, Nov. 1996, Texas Instrument, pp. 1-8.*
Goldwasser, Basic Testing of Semiconductor Devices and other Information Including Introduction to Curve Tracers, Nov. 2006, Science Electronic Repair, Version 2.45, pp. 19-20.*
Railesha M. Detect 4-To-20 MA Loop Faults, Electronic Design, Penton Media, vol. 41, No. 3, Feb. 1993, pp. 72-73.
EP 09 25 0136 Search Report dated May 12, 2009.
Optocoupler GFH 600 für 4 kV (GFH 601 für 5,6kV), Elektro-Anzeiger, Konradin Verlag, DE, vol. 12, Jg. 1980 No. 9, p. 42 with English Translation.

* cited by examiner

*Primary Examiner* — Stephen W Jackson
*Assistant Examiner* — Tien Mai
(74) *Attorney, Agent, or Firm* — Louis J. Capezzuto

(57) ABSTRACT

Apparatus for testing an opto-switch includes a first sense resistor coupled between a power source and an input of the opto-switch, and a second sense resistor coupled to an output of the opto-switch. A test circuit is coupled to sense a first current flowing through the first sense resistor and a second current flowing through the second sense resistor and to generate a test signal responsively to a relation between the first and second currents. A controller is coupled to receive the test signal and to perform a protective action when the test signal exceeds a predetermined limit.

13 Claims, 3 Drawing Sheets

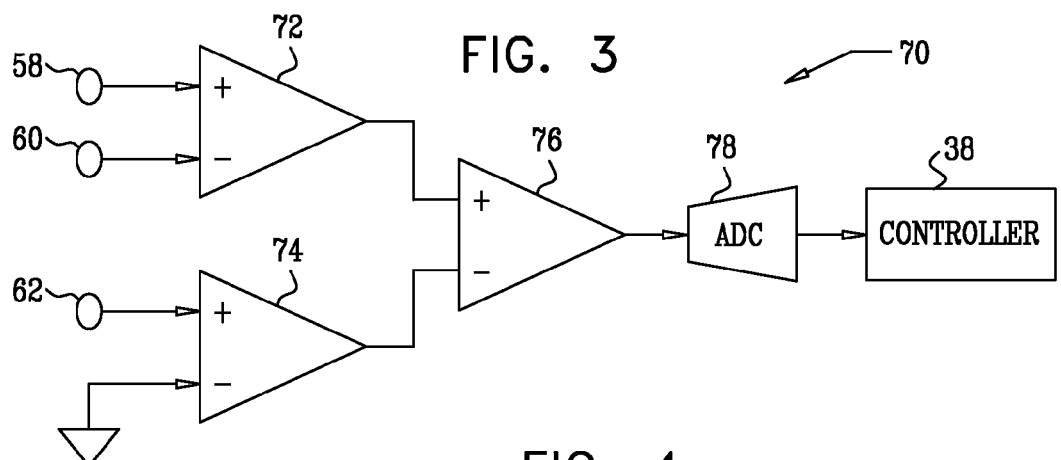
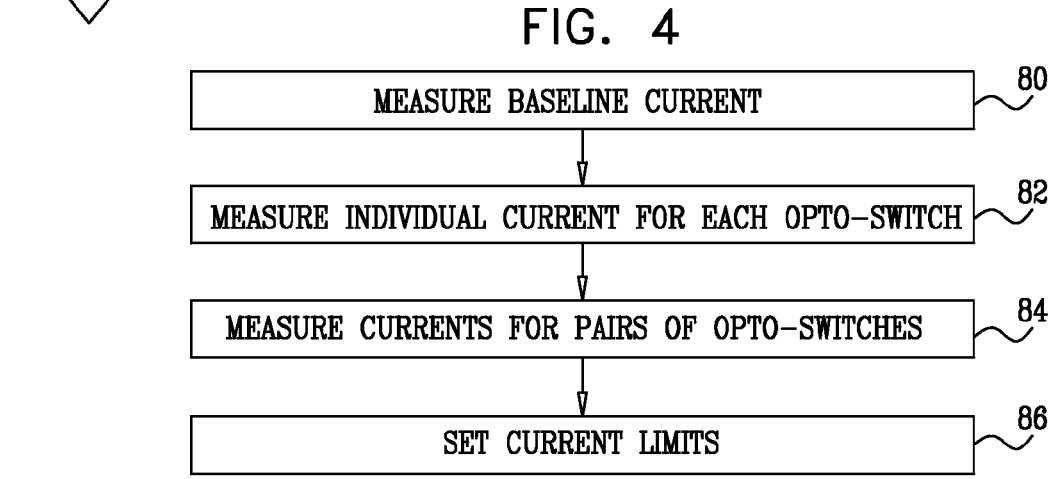
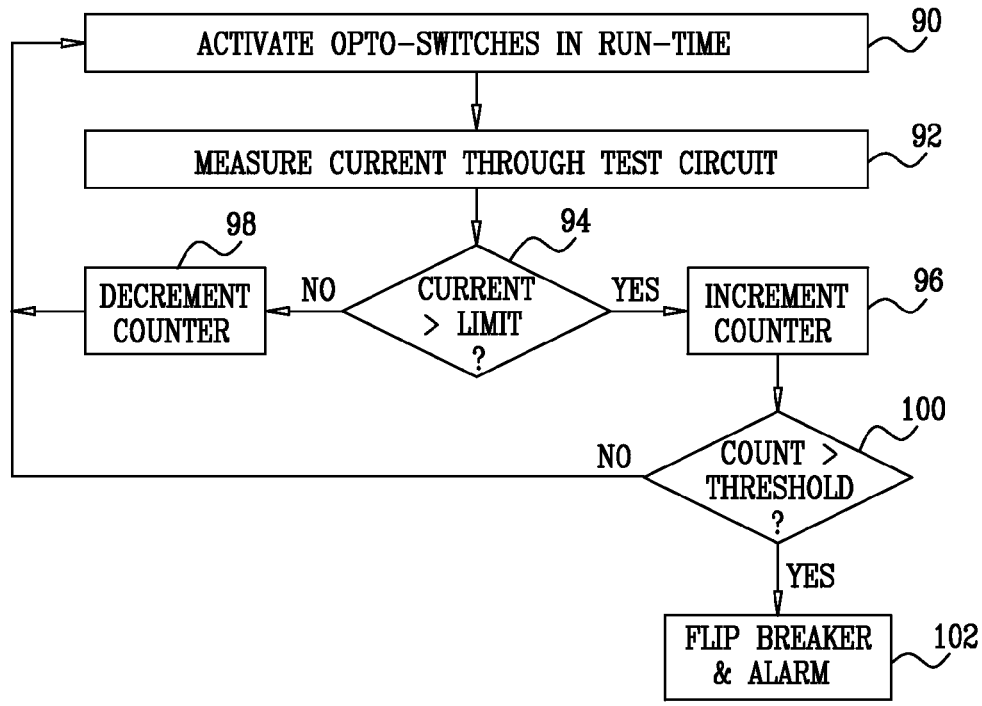

DETECTION OF CURRENT LEAKAGE THROUGH OPTO-SWITCHES

FIELD OF THE INVENTION

The present invention relates generally to electronic circuits and devices, and specifically to device testing and safety.

BACKGROUND OF THE INVENTION

Opto-switches (also referred to as opto-isolators or opto-couplers) use a short optical transmission path to transfer a signal between elements of a circuit while keeping the elements electrically isolated. They are used in medical devices to prevent current leakage from the circuits of the device to the patient's body. Opto-switches are supposed to be effectively leakage-free even under high voltage. If an opto-switch fails, however, it may permit high leakage current to reach the patient. When the leakage current flows through a cardiac catheter, for example, the consequences can be fatal.

SUMMARY OF THE INVENTION

The inventor has found that even when opto-switches are pre-tested and qualified before installation in a medical device, the opto-switches may still occasionally fail when the device is in operation. It can be critically important to protect against such failures when the device is in contact with a patient's body. In embodiments of the present invention, a test circuit is added to the medical device, in order to permit this sort of failure to be detected reliably. The test circuit outputs a test signal, which is indicative of leakage current through an opto-switch. A controller receives the signal and takes protective action when the signal exceeds a predetermined limit.

In some embodiments, the test signal is measured during a calibration stage, before the device is brought into contact with the body. This calibration test signal is used in setting limits to be used by the controller in monitoring the test signal that is generated during actual operation of the device. The calibration procedure helps to compensate for differences between different components and different devices. It facilitates sensitive detection and control of leakage without expensive, high-accuracy components in the test and measurement circuits.

There is therefore provided, in accordance with an embodiment of the present invention, apparatus for testing an opto-switch, including:

a first sense resistor coupled between a power source and an input of the opto-switch;

a second sense resistor coupled to an output of the opto-switch;

a test circuit, which is coupled to sense a first current flowing through the first sense resistor and a second current flowing through the second sense resistor and to generate a test signal responsively to a relation between the first and second currents; and a controller, which is coupled to receive the test signal and to perform a protective action when the test signal exceeds a predetermined limit.

In a disclosed embodiment, the opto-switch is used in a medical device to prevent current leakage to a body of a patient, and the test circuit and the controller are installed in the medical device so as to perform the protective action while the medical device is in contact with the body. Typically, the controller is configured to determine the limit by measuring the test signal during a calibration stage carried out while the medical device is not in contact with the body.

In some embodiments, the protective action includes disconnecting the power source from the opto-switch. In one embodiment, the controller is configured to increment a counter upon determining that the test signal has exceeded the limit, and to disconnect the opto-switch from the power source when the counter reaches a predetermined threshold. The controller may be configured to decrement the counter upon determining that the test signal is below the limit.

In a disclosed embodiment, the apparatus includes a multiplexing circuit, which is configured to couple the power source and the first and second sense resistors to each of a plurality of opto-switches, and the controller is configured to evaluate the test signal due to each of the opto-switches that is selected by the multiplexing circuit. The multiplexing circuit may be configured to couple each of a multiplicity of pairs of the opto-switches simultaneously to the power source and to the first and second sense resistors, so that the test circuit senses the first and second currents for each of the pairs, and the controller may be configured to evaluate the test signal due to each of the pairs.

In one embodiment, the test circuit includes a first differential amplifier coupled across the first sense resistor and having a first output, a second differential amplifier coupled across the second sense resistor and having a second output, and a third differential amplifier coupled across the first and second outputs for generating the test signal responsively to a difference between the first and second currents.

There is also provided, in accordance with an embodiment of the present invention, a method for testing an opto-switch in a medical device, the method including:

during a calibration stage, measuring a first relation between a first current flowing into an input of the opto-switch and a second current flowing out of an output of the opto-switch, and generating a first test signal responsively to the first relation;

responsively to the first test signal, setting a limit with respect to a leakage current through the opto-switch;

during operation of the medical device in contact with a body of a patient, generating a second test signal responsively to a second relation between the first and second currents flowing respectively into the input and out of the output of the opto-switch; and performing a protective action when the second test signal exceeds the limit.

The present invention will be more fully understood from the following detailed description of the embodiments thereof, taken together with the drawings in which:

BRIEF DESCRIPTION OF THE DRAWINGS

FIG. 3 is a schematic circuit diagram showing a test circuit for use in conjunction with the circuitry of FIG. 2, in accordance with an embodiment of the present invention;

FIG. 4 is a flow chart that schematically illustrates a method for calibration of opto-switching circuitry, in accordance with an embodiment of the present invention; and FIG. 5 is a flow chart that schematically illustrates a method for testing opto-switches, in accordance with an embodiment of the present invention.

DETAILED DESCRIPTION OF EMBODIMENTS

Figure 1:
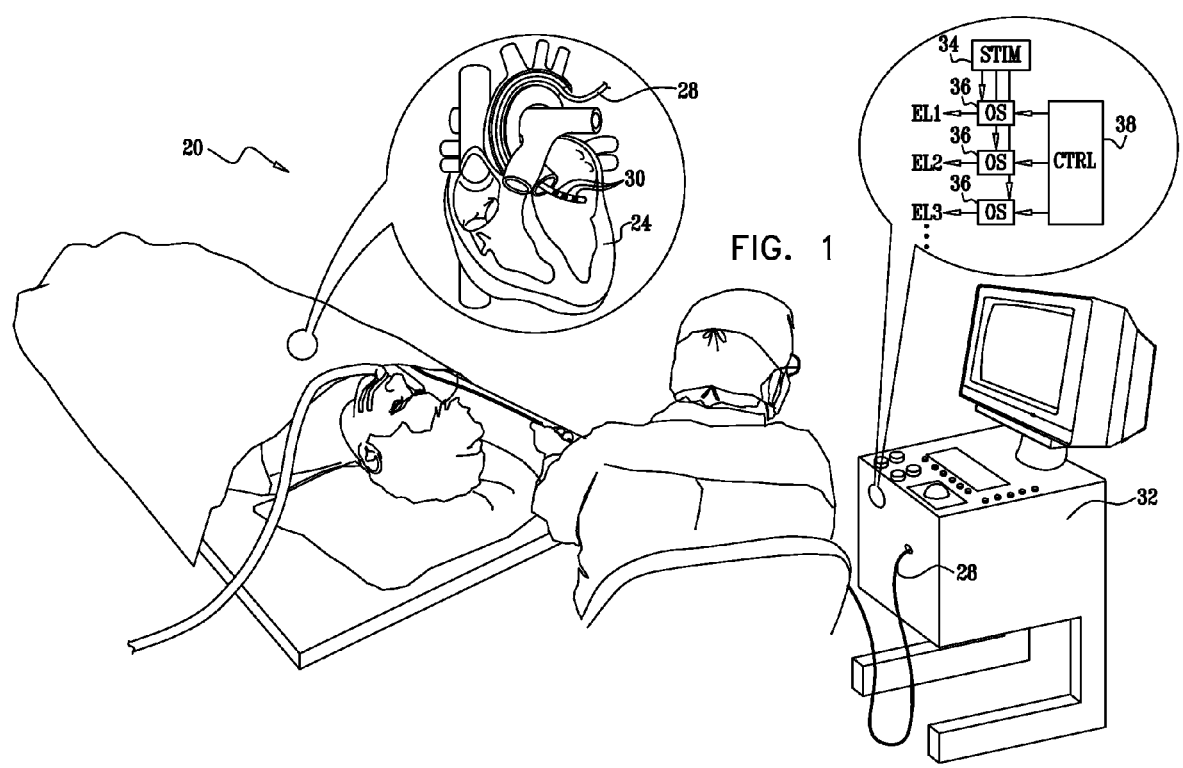
FIG. 1 is a schematic, pictorial illustration of an invasive medical system, in accordance with an embodiment of the present invention.

FIG. 1 is a schematic, pictorial illustration of an invasive medical system 20 for treating a patient 22, in accordance with an embodiment of the present invention. This system is shown here by way of example, as an aid to understanding an application of the present invention. The principles of the invention, however, are in no way limited to this particular sort of system and may be applied in conjunction with substantially any kind of electrical medical device that comes into contact with a patient's body. The circuits and techniques for testing opto-isolators that are described hereinbelow may also be adapted for use in systems and devices of other types in which opto-isolators are used for electrical isolation.

An operator 26 of system 20 inserts a catheter 28 into a heart 24 of patient 22. In this example, the distal end of the catheter (shown inside the heart in the left inset in FIG. 1) comprises multiple electrodes 30. The electrodes are used in a diagnostic procedure in the heart, under control of the operator via a console 32. In the console (as shown in the right inset in the figure), a stimulator 34 generates stimulation signals, which are applied to electrodes 30 (referred to as EL1, EL2, ... ) via respective opto-switches 36. Any suitable type of opto-switches may be used in system 20, such as the CPC1018N device, produced by Clare Inc. (Beverly, Mass.).

A digital controller 38 controls the operation of the opto-switches. Controller 38 typically comprises a microprocessor, which has suitable input and output interfaces and is programmed in software to carry out the functions that are described herein. Alternatively or additionally, controller 38 may comprise dedicated or programmable digital logic circuits.

Figure 2:
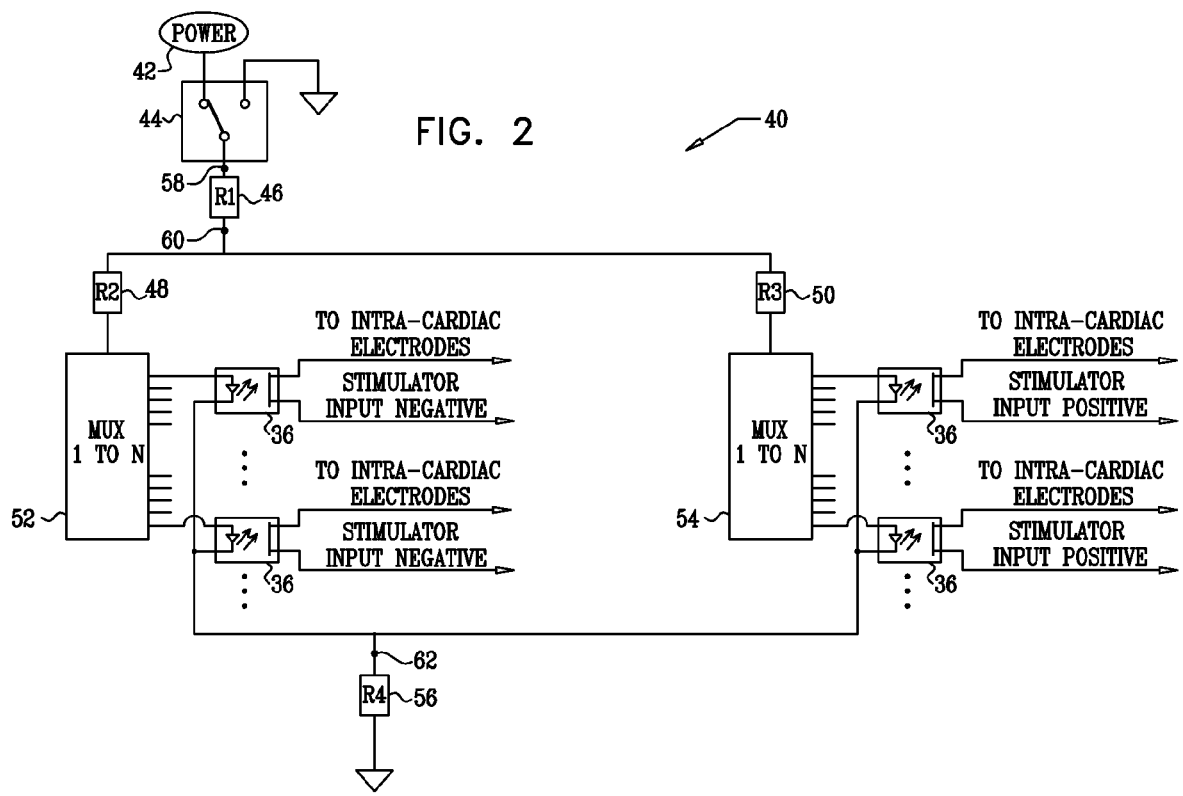
FIG. 2 is a schematic circuit diagram showing opto-switching circuitry in a medical device, in accordance with an embodiment of the present invention.

FIG. 2 is a schematic circuit diagram showing further details of opto-switching circuitry 40 in console 32, in accordance with an embodiment of the present invention. In the configuration shown in FIG. 2, one set of opto-switches 36 (on the left side of the figure) is coupled to connect electrodes 30 to a negative input from stimulator 34, while the other set of the opto-switches (on the right side of the figure) is coupled to connect the electrodes to a positive input from the stimulator. The opto-switches are selected by multiplexing circuits 52 and 54. By appropriate selection of the opto-switches, electrodes 30 may thus be activated in either a monopolar or a bipolar stimulation mode. This configuration of the opto-switches and associated circuitry is shown merely by way of example, and the principles of the present invention may be implemented to test substantially any sort of circuitry that uses one or more opto-switches for electrical isolation.

A power source 42 supplies power to opto-switches 36 via a breaker switch 44 and current-limiting resistors (R2, R3) 48 and 50. An input sense resistor (R1) 46 is coupled between power source 42 and the inputs of the opto-switches, while an output sense resistor (R4) 56 is coupled between the outputs of the opto-switches and ground. Typically, these resistors are standard, inexpensive components, having resistance in a range that depends on the leakage current level that is to be sensed. For example, in one implementation, the inventor used sense resistors of 33.2Ω, with 1% precision, so that a 10 µA leakage current gave a voltage drop of about 330 µV. On account of the calibration procedure that is described hereinbelow, controller 38 is able to detect changes in leakage current through the opto-switches with high sensitivity without requiring the use of costly, high-precision resistors in circuitry 40.

In the absence of any leakage through the opto-switches, the current flowing through resistor 46 should be identical to that flowing through resistor 56. These currents are proportional, respectively, to the voltage drop between test points 58 and 60 and to the voltage drop between a test point 62 and ground. Any significant change in the relation between these two voltage drops may be indicative of a failure of one or more of the opto-switches.

FIG. 3 is a schematic circuit diagram showing a test circuit 70 for use in detecting leakage of opto-switches 36 in circuitry 40, in accordance with an embodiment of the present invention. Circuit 70 comprises a pair of differential amplifiers 72 and 74, such as instrumentation amplifiers. The differential inputs of amplifier 72 are connected to test points 58 and 60 (FIG. 2), while those of amplifier 74 are connected to test point 62 and ground. Amplifiers 72 and 74 output signals that are proportional to the respective currents flowing through sense resistors 46 and 56. These signals are input to another differential amplifier 76, which thus outputs a signal that is proportional to the difference between the respective currents flowing through the sense resistors. An analog/digital converter (ADC) 78 digitizes the output signal, and controller 38 processes the digitized result in order to detect possible leakage.

In the implementation described above, for example (with 33.2Ω sense resistors), the inventor set the gain factor of amplifiers 72, 74 and 76 to be twenty, giving a total amplification of 400. Thus, 10 µA of leakage current gave a signal of 132 mV at the output of amplifier 76. This signal was fed to a 12-bit ADC, set to a sensitivity of 1 bit/mV. These parameter values are given here, however, solely by way of illustration, and different parameters may alternatively be used depending on system and application requirements.

In an alternative embodiment (not shown in the figures), separate sense resistors and test circuits may be used for the group of negative-input opto-switches (those connected to multiplexing circuit 52) and the group of positive-input opto-switches (connected to multiplexing circuit 54). This approach adds a certain additional complexity to the system, but it is advantageous in permitting precise identification of a leaking opto-switch.

FIG. 4 is a flow chart that schematically illustrates a method for calibrating measurements made by test circuit 70 on circuitry 40, in accordance with an embodiment of the present invention. This calibration procedure is typically performed after system 20 is powered up, but before any part of the system is brought into contact with patient 22. It may be performed once, in the factory, for example, or it may be performed as part of the start-up procedure whenever system 20 is powered up. The calibration procedure checks the actual output of test circuit 70 when connected to circuitry 40, and uses this output to set limits for subsequent monitoring of the opto-switches in the circuitry, as described below with reference to FIG. 5. On account of this calibration procedure, controller 38 is able during operation of system 20 to detect small changes in the leakage current through the opto-switches in circuitry 40, typically on the order of 0.2% of the current applied by power source 42 (for example, a change in leakage of 10 µA with 5 mA of applied current), notwithstanding imprecision of the electrical components in circuitry 40.

Initially, controller 38 measures the output of circuit 70 with none of opto-switches 36 in circuitry 40 selected, at a baseline measurement step 80. In other words, the controller records the digitized signal that is output by ADC 78 while multiplexing circuits 52 and 54 keep all of the opto-switches disconnected from power source 42. The controller uses this measurement in setting the baseline current limit to be used in monitoring circuitry 40 during actual operation.

Next, the multiplexing circuits select each of the opto-switches individually, and the controller measures the output signal from circuit 70 for each opto-switch, at an individual current measurement step 82.

In addition, the multiplexing circuits select pairs of opto-switches, i.e., multiplexing circuit 52 selects one opto-switch on the negative side while multiplexing circuit 54 selects one opto-switch on the positive side, at a pair measurement step 84. The controller measures the output signal from circuit 70 for each such pair. (Step 84 is omitted, however, if separate test circuits are used for the negative and positive groups of opto-switches in the alternative embodiment mentioned above.)

Based on the measurements in steps 80, 82 and 84, controller 38 sets current limits to be used in run-time monitoring, at a limit setting step 86. The baseline limit may be set, for example, by taking the average baseline current difference between sense resistors 46 and 56, as measured by circuit 70, over a given measurement period in step 80, and then allowing a certain margin above and below the average. The margin depends on the desired sensitivity in detecting deviations, balanced against the possible nuisance of false alarms. The inventor has found that a margin of about 10 µA gives good results. General limits for leakage of an individual opto-switch may be calculated by averaging the results measured for all the individual opto-switches at step 82 and then adding an appropriate margin. The general limits for leakage of a pair of opto-switches may likewise be calculated based on the averaged results of step 84.

Additionally or alternatively, controller 38 may compute and store an individual limit for each opto-switch and/or each pair of opto-switches, based on the measured results for that specific opto-switch or pair.

As a further option, if the controller measures a high current through a given opto-switch or pair of opto-switches in the calibration stage, the controller may immediately output an alarm identifying the opto-switch or switches in question as suspect. In this manner, component failures can be identified and resolved before any part of system 20 is brought into contact with the patient.

FIG. 5 is a flow chart that schematically illustrates a method for testing the operation of opto-switches 36 in circuitry 40, in accordance with an embodiment of the present invention. During run-time operation, different opto-switches or pairs of opto-switches are actuated by multiplexing circuits 52 and 54, at an opto-switch activation step 90. In the case of system 20, for example, the opto-switches are typically actuated in order to apply stimulation signals through different electrodes 30 on catheter 28, as explained above. Controller 38 may select the opto-switches to actuate, or it may simply receive an input indicating which opto-switches are actuated at any given time. The controller chooses the applicable calibrated current limits to use in monitoring the output of circuit 70, as determined at step 86 (FIG. 4), depending on the selection of opto-switches.

Controller 38 receives digital values from ADC 78, at an output measurement step 92. As explained above, these values are indicative of the current difference measured by circuit 70. The controller compares these values to the applicable limit, at a current testing step 94. If the measured value is greater than the limit, the controller increments a counter, at an incrementation step 96. The counter value typically starts at zero and increases with each successive measurement that is over the limit. The counter is used in order to avoid responding actively to every over-limit measurement, since single measurements may be over the limit due to noise, rather than actual leakage. If a subsequent measurement is below the applicable limit, controller 38 decrements the counter value, at a decrementation step 98. The value may be decremented in this manner back down to zero, but not lower.

After incrementing the counter at step 96, controller 38 checks whether the counter value has reached a predetermined threshold, at a threshold checking step 100. The choice of threshold typically depends on the duration of leakage that is considered to be dangerous. For example, assuming the controller receives the ADC digital output at 8000 samples/sec, the threshold may be set to about 8000 so that leakage current lasting one second triggers the threshold. When the count reaches the threshold, controller 38 takes protective action, at a protection step 102. For example, the controller may flip breaker switch 44 to disconnect power from the opto-switch and may generate an alarm output indicating which opto-switch or pair of opto-switches was responsible for the high leakage level. These components may then be replaced by a service technician. On the other hand, when separate test circuits are used for the negative and positive groups of the opto-switches, as described above, it may be possible to identify and power-off the leaky opto-switch without removing power from the remaining opto-switches.

Alternatively, it may be preferable simply to replace the entire circuit board containing the opto-switches. In particular, the entire circuit board is replaced if the count reaches the threshold at step 100 while no opto-switch is selected (meaning that the measured current was greater than the baseline current limit).

Thus, the circuits and methods described above permit sensitive detection and control of leakage without requiring expensive, high-accuracy components. The calibration procedure accounts for differences that may occur between different components and different circuit cards. The use of the counter to monitor deviations from the calibrated limits is also helpful in distinguishing actual failures from transient excursions due to "noisy" components, since the counter will generally average out transient changes without reaching the threshold. Monitoring multiple opto-switches together is useful both in detecting failures of single components during run-time and in detecting multi-component failures that may occur in a bad batch of components.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. Apparatus for testing an opto-switch, comprising:
    a first sense resistor coupled between a power source and an input of the opto-switch;
    a second sense resistor coupled to an output of the opto-switch;
    a test circuit, which is coupled to sense a first current flowing through the first sense resistor and a second current flowing through the second sense resistor and to generate a test signal responsively to a relation between the first and second currents; and
    a controller, which is coupled to receive the test signal and to perform a protective action when the test signal exceeds a predetermined limit, wherein the protective action comprises disconnecting the power source from the opto-switch and wherein the controller is configured to increment a counter upon determining that the test signal has exceeded the limit, and to disconnect the opto-switch from the power source when the counter reaches a predetermined threshold, and wherein the controller is configured to decrement the counter upon determining that the test signal is below the limit.

2. The apparatus according to claim 1, wherein the opto-switch is used in a medical device to prevent current leakage to a body of a patient, and wherein the test circuit and the controller are installed in the medical device so as to perform the protective action while the medical device is in contact with the body.

3. The apparatus according to claim 2, wherein the controller is configured to determine the limit by measuring the test signal during a calibration stage carried out while the medical device is not in contact with the body.

4. The apparatus according to claim 1, and comprising a multiplexing circuit, which is configured to couple the power source and the first and second sense resistors to each of a plurality of opto-switches, and wherein the controller is configured to evaluate the test signal due to each of the opto-switches that is selected by the multiplexing circuit.

5. The apparatus according to claim 4, wherein the multiplexing circuit is configured to couple each of a multiplicity of pairs of the opto-switches simultaneously to the power source and to the first and second sense resistors, so that the test circuit senses the first and second currents for each of the pairs, and wherein the control.

6. A method for testing an opto-switch in a medical device, the method comprising:
  during a calibration stage, measuring a first relation between a first current flowing into an input of the opto-switch and a second current flowing out of an output of the opto-switch, and generating a first test signal responsively to the first relation;
  responsively to the first test signal, setting a limit with respect to a leakage current through the opto-switch;
  during operation of the medical device in contact with a body of a patient, generating a second test signal responsively to a second relation between the first and second currents flowing respectively into the input and out of the output of the opto-switch; and
  performing a protective action when the second test signal exceeds the limit, wherein performing the protective action comprises disconnecting the opto-switch from a power source that supplies the first and second currents, and wherein performing the protective action comprises incrementing a counter upon determining that the second test signal has exceeded the limit, and disconnecting the opto-switch from the power source when the counter reaches a predetermined threshold, and decrementing the counter upon determining that the second test signal is below the limit.

7. The method according to claim 6, wherein the operation of the medical device comprises multiplexing among a plurality of opto-switches, and wherein generating the second test signal comprises evaluating the second test signal due to each of the opto-switches that is selected by the multiplexing.

8. The method according to claim 7, wherein multiplexing among the plurality of the opto-switches comprises selecting each of a multiplicity of pairs of the opto-switches and sensing the first and second currents for each of the pairs, and wherein evaluating the second test signal comprises checking the second test signal due to each of the pairs.

9. Apparatus for testing an opto-switch, comprising:
  a first sense resistor coupled between a power source and an input of the opto-switch;
  a second sense resistor coupled to an output of the opto-switch;
  a test circuit, which is coupled to sense a first current flowing through the first sense resistor and a second current flowing through the second sense resistor and to generate a test signal responsively to a relation between the first and second currents; and
  a controller, which is coupled to receive the test signal and to perform a protective action when the test signal exceeds a predetermined limit, wherein the test circuit comprises a first differential amplifier coupled across the first sense resistor and having a first output, a second differential amplifier coupled across the second sense resistor and having a second output, and a third differential amplifier coupled across the first and second outputs for generating the test signal responsively to a difference between the first and second currents.

10. A method for testing an opto-switch in a medical device, the method comprising:
  during a calibration stage, measuring a first relation between a first current flowing into an input of the opto-switch and a second current flowing out of an output of the opto-switch, and generating a first test signal responsively to the first relation;
  responsively to the first test signal, setting a limit with respect to a leakage current through the opto-switch;
  during operation of the medical device in contact with a body of a patient, generating a second test signal responsively to a second relation between the first and second currents flowing respectively into the input and out of the output of the opto-switch; and
  performing a protective action when the second test signal exceeds the limit, wherein the first and second relations respectively comprise first and second differences between the first and second currents.

11. The method according to claim 10, wherein the operation of the medical device comprises multiplexing among a plurality of opto-switches, and wherein generating the second test signal comprises evaluating the second test signal due to each of the opto-switches that is selected by the multiplexing.

12. The method according to claim 11, wherein multiplexing among the plurality of the opto-switches comprises selecting each of a multiplicity of pairs of the opto-switches and sensing the first and second currents for each of the pairs, and wherein evaluating the second test signal comprises checking the second test signal due to each of the pairs.

13. A method for testing an opto-switch in a medical device, the method comprising:
  during a calibration stage, measuring a first relation between a first current flowing into an input of the opto-switch and a second current flowing out of an output of the opto-switch, and generating a first test signal responsively to the first relation;
  responsively to the first test signal, setting a limit with respect to a leakage current through the opto-switch;
  during operation of the medical device in contact with a body of a patient, generating a second test signal responsively to a second relation between the first and second currents flowing respectively into the input and out of the output of the opto-switch; and
  performing a protective action when the second test signal exceeds the limit, wherein the operation of the medical device comprises multiplexing among a plurality of opto-switches, and wherein generating the second test signal comprises evaluating the second test signal due to each of the opto-switches that is selected by the multiplexing, wherein setting the limit comprises finding an average of the first test signal over the plurality of the opto-switches, and setting the limit responsively to the average.

* * * * *